United States Patent
Petrarca et al.

(10) Patent No.: US 6,982,493 B2
(45) Date of Patent: Jan. 3, 2006

(54) WEDGEBOND PADS HAVING A NONPLANAR SURFACE STRUCTURE

(75) Inventors: Kevin Shawn Petrarca, Newburgh, NY (US); Richard Paul Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 10/249,382

(22) Filed: Apr. 3, 2003

(65) Prior Publication Data

US 2004/0195679 A1    Oct. 7, 2004

(51) Int. Cl.
*H01L 23/48*  (2006.01)
*H01L 23/52*  (2006.01)

(52) U.S. Cl. ............................... 257/784; 257/758
(58) Field of Classification Search ............ 257/784, 257/779–780, 758; 438/612
See application file for complete search history.

(56) References Cited

U.S. PATENT DOCUMENTS

| | | | |
|---|---|---|---|
| 5,635,424 A * | 6/1997 | Rostoker et al. | 438/612 |
| 5,703,408 A | 12/1997 | Ming-Tsung et al. | |
| 6,143,396 A | 11/2000 | Saran et al. | |
| 6,198,170 B1 | 3/2001 | Zhao | |
| 6,232,243 B1 * | 5/2001 | Farnworth et al. | 438/763 |
| 6,232,662 B1 | 5/2001 | Suran | |
| 6,313,651 B1 * | 11/2001 | Hembree et al. | 324/755 |
| 6,444,295 B1 * | 9/2002 | Peng et al. | 428/209 |
| 6,448,650 B1 | 9/2002 | Saran et al. | |
| 6,683,383 B2 * | 1/2004 | Gleixner et al. | 257/764 |
| 2001/0051426 A1 | 12/2001 | Pozder et al. | |
| 2002/0068385 A1 | 6/2002 | Ma et al. | |
| 2004/0026480 A1 * | 2/2004 | Imai et al. | 228/110.1 |

* cited by examiner

*Primary Examiner*—Phat X. Cao
*Assistant Examiner*—Theresa T. Doan
(74) *Attorney, Agent, or Firm*—Ira D. Blecker

(57) ABSTRACT

Disclosed is a wedgebond pad structure which includes a semiconductor substrate and a wedgebond pad. The wedgebond pad has a surface which includes a curved or v-shaped feature for receiving a wedge bond. The curved or v-shaped feature may be raised or recessed with respect to the wedgebond pad surface.

7 Claims, 7 Drawing Sheets

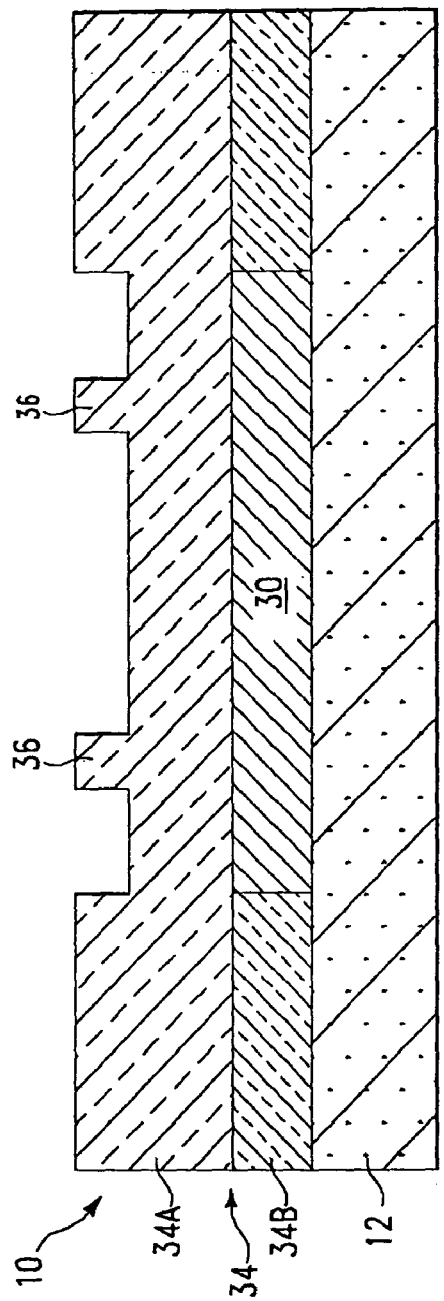
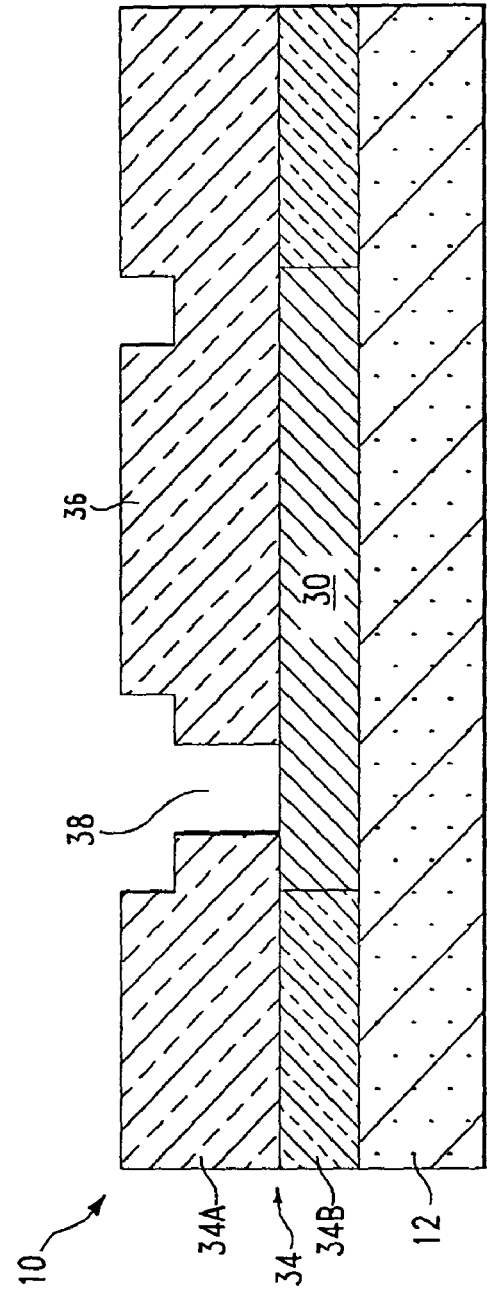
FIG. 5A
FIG. 5B

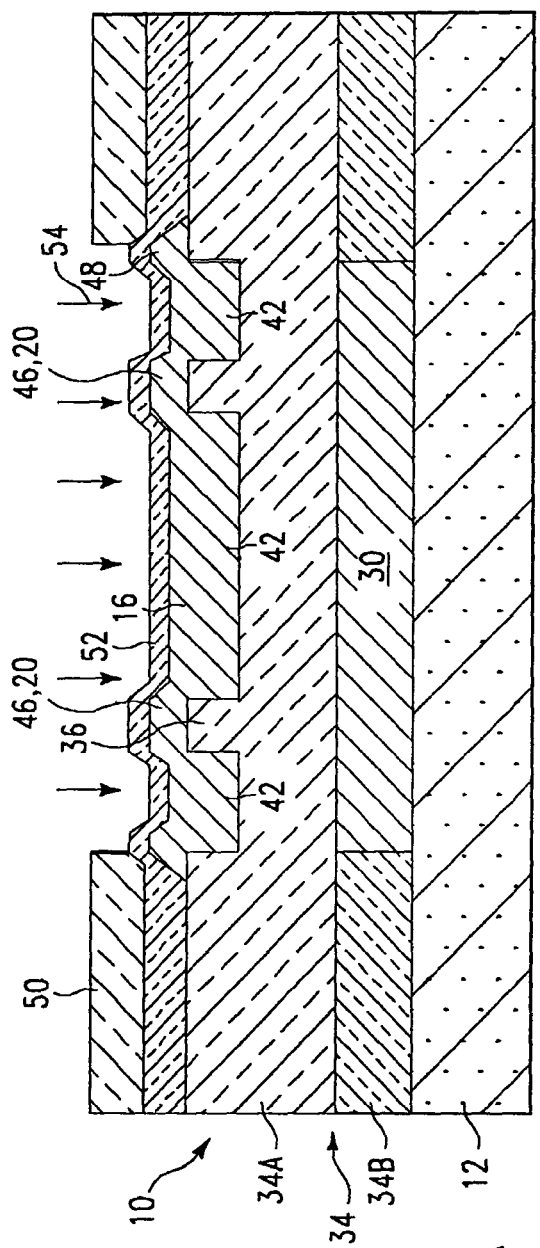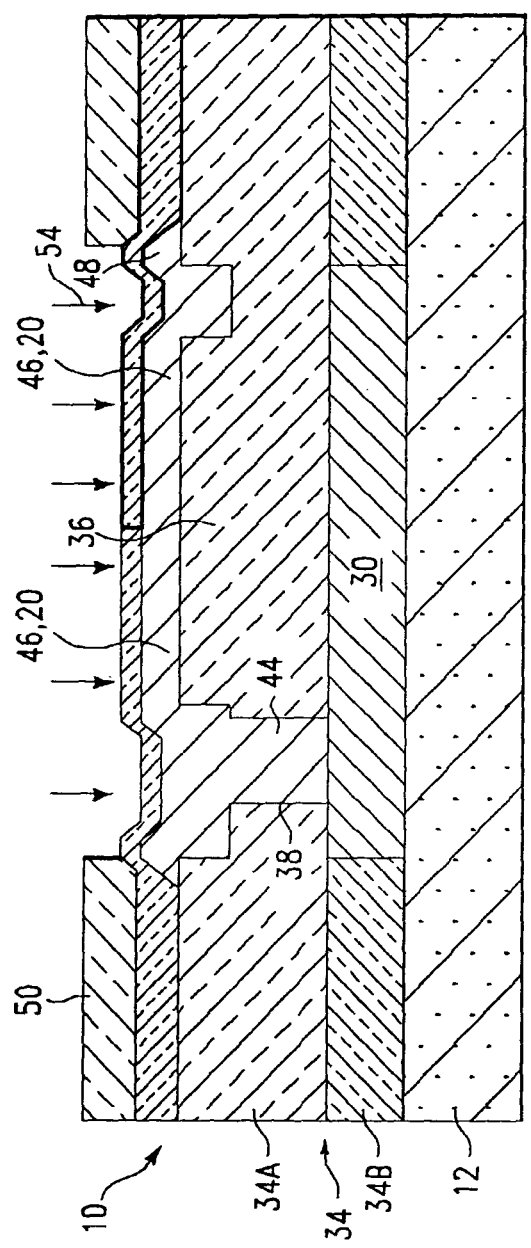
FIG. 7A
FIG. 7B

WEDGEBOND PADS HAVING A NONPLANAR SURFACE STRUCTURE

CROSS REFERENCE TO RELATED APPLICATIONS

This application is related to U.S. patent application Ser. No. 10/249,381 entitled Internally Reinforced Bond Pads, filed even date herewith and incorporated by reference herein.

BACKGROUND OF INVENTION

The present invention relates generally to integrated circuits and, more particularly, relates to integrated circuits having a mechanically robust bond pad.

Integrated circuits are formed on semiconductor substrates using a number of different processing operations that create the circuit elements. In order to access circuitry associated with the semiconductor substrate, bond pads are formed on the integrated circuits. Bond pads provide the means for transfer of electrical signals and power from and to the semiconductor substrate via probes, bonding wires, conductive bumps, etc.

Bond pads are typically formed of aluminum because aluminum is self-passivating and, therefore, more resistant to degradation from atmospheric pressure. Aluminum, and more recently, copper are used for the metal layers within the integrated circuit. Copper is more preferred because of its improved electromigration performance and ability to support higher current density as compared to aluminum.

In order to realize the advantages of the self-passivating character of aluminum and the superior electrical characteristics of copper, composite bond pad structures can be used in integrated circuit designs. In composite bond pad structures, copper is used for the underlying layer of the pad that interfaces with other layers in the integrated circuit. A corrosion-resistant aluminum capping layer is formed on top of the copper portion that creates an hermetic seal that protects the copper portion from atmospheric exposure. In order to physically separate the copper and aluminum portions of the composite bond pad while allowing for electrical connectivity, a relatively thin barrier metal layer may be formed at the interface.

Problems can arise in composite bond pad structures when test, probe and bond operations are performed. To achieve good electrical continuity with the bond pad, elements such as probes must exert forces that can damage or displace portions of the bond pad surface. In addition, if the probe exposes the underlying copper to the ambient, degradation of the copper can occur. Too, bonding such as wedge bonding can exert large forces on the bond pad.

Another problem that can arise with bond pad structures concerns the physical force exerted on the bond pad by a probe or wedge bond that can propagate to lower layers based on the physical couplings within the integrated circuit. Low Young's modulus dielectrics underlying the bond pad may not be able to support such stress resulting from the force propagation.

Various solutions have been proposed for improving bond pad integrity.

Pozder et al. U.S. Patent Application Publication US 2001/0051426, the disclosure of which is incorporated by reference herein, discloses in FIG. 2 a composite bond pad comprising copper (but alternatively could comprise aluminum), dielectric support structures and then a final layer of aluminum. The dielectric support structures can have different configurations as shown in FIG. 5 of the reference. These support structures provide mechanical shielding of the interface formed between the aluminum layer and the underlying copper layer.

Ma et al. U.S. Patent Application Publication US 2002/0068385, the disclosure of which is incorporated by reference herein, discloses an anchored bond pad in which a bond pad is formed on a dielectric layer wherein the dielectric layer has via openings which are filled with metal. The metal-filled via openings secure the bond pad to the dielectric layer.

Ming-Tsung et al. U.S. Pat. No. 5,703,408, the disclosure of which is incorporated by reference herein, discloses a bond pad structure in which stripes are formed in a sublayer which induce an irregular surface of the top metallic bond pad. An object of this particular arrangement is to increase the adhesion of the various layers that make up the bonding pad. Similarly, Mukogawa Japanese Published Patent Application JP 3-96236, the disclosure of which is incorporated by reference herein, discloses an irregular sublayer which induces an irregular surface of the top layer.

Saran et al. U.S. Pat. No. 6,143,396, Saran U.S. Pat. No. 6,232,662, Zhao U.S. Pat. No. 6,198,170, and Saran et al. U.S. Pat. No. 6,448,650, the disclosures of which are incorporated by reference herein, all disclose various reinforcing schemes under the bonding pad. Thus, in Saran et al. U.S. Pat. No. 6,143,396, a metal bond pad is supported by a layer of dielectric and a reinforcing structure. In Saran U.S. Pat. No. 6,232,662, a metal bond layer is supported by an interlevel dielectric layer and a reinforcing layer comprising metal and reinforcing dummy structures. In Zhao U.S. Pat. No. 6,198,170, a bonding pad is supported by a large via and several layers of alternating segments of metal and dielectric. Lastly, in Saran et al. U.S. Pat. No. 6,448,650, a metal bonding pad is supported by a first dielectric, then an interlevel dielectric and finally by a reinforcing layer comprising alternating dielectric and metal.

A need exists for an improved bond pad that can survive forces applied by wedge bonding and packaging and which will protect the underlying metal layer, preferably which is copper.

Accordingly, it is an object of the present invention to have an improved bond pad which is mechanically robust to survive the forces of wedge bonding and packaging.

It is another object of the present invention to have an improved bond pad which can survive wedge bonding and packaging and which can also protect the underlying metal layer.

These and other objects of the present invention will become more apparent after referring to the following description of the invention considered in conjunction with the accompanying drawings.

SUMMARY OF INVENTION

The objects of the invention have been achieved by providing, according to a first aspect of the present invention, a wedgebond pad structure comprising:

a semiconductor substrate; and a wedgebond pad having a surface comprising a curved or v-shaped feature for receiving a wedge bond.

According to a second aspect of the present invention, there is provided a wedgebond pad structure comprising:

a substrate;

a metallic layer formed on the substrate;

a dielectric layer over the metallic layer, at least one through via to the metallic layer and at least a portion of the dielectric layer comprising a nonplanar dielectric structure;

a metallic bond layer conformally formed over the nonplanar structure of the dielectric layer such that the nonplanar dielectric structure is substantially reproduced in the metallic bond layer as a nonplanar metallic structure, the metallic bond layer further formed in the through via so as to contact the metallic layer, wherein the nonplanar metallic structure has a curved or v-shaped feature for receiving a wedge bond.

According to a third aspect of the present invention, there is provided a wedgebond pad assembly comprising:

a wedgebond pad structure comprising a semiconductor substrate and a wedgebond pad having a surface comprising a curved or v-shaped feature for receiving a wedge bond; and a wedgebond received by the curved or v-shaped feature.

BRIEF DESCRIPTION OF DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 5 to 9 illustrate a process for forming a semiconductor device having the wedgebond pad design of FIG. 1.

DETAILED DESCRIPTION

Figure 1:
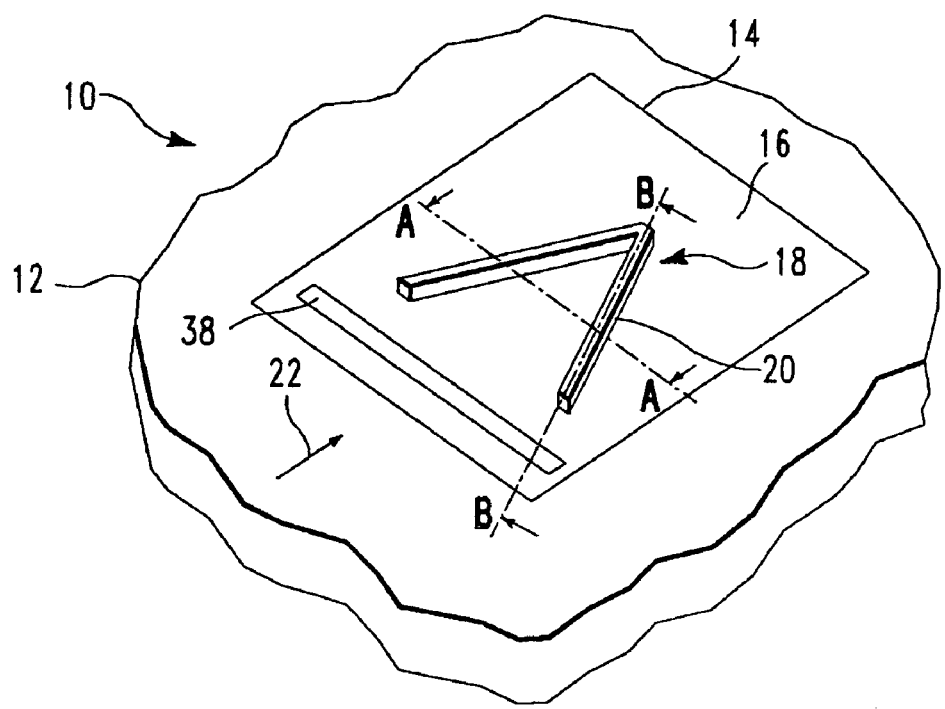
FIGS. 1 to 4 are perspective views of wedgebond pad designs according to the present invention.

Referring to the Figures in more detail, and particularly referring to FIGS. 1 to 4, there are shown four embodiments of a wedgebond structure according to the present invention. Referring first to FIG. 1, wedgebond structure 10 comprises substrate 12 and wedgebond pad 14. The wedgebond pad 14 has a nonplanar structure 18 which includes a v-shaped feature 20. The v-shaped feature 20 extends above the surface 16 of the wedgebond pad 14 and is also parallel to the surface 16. During the formation of a wedgebond, the wire forming the would approach the v-shaped feature 20 in the direction indicated by arrow 22. Thus, the wedgebond (not shown) would be caught or received by the v-shaped feature 20. In so doing, the wedgebond is exposed to more than one bonding surface allowing for a more effective bond. Further shown in FIG. 1 is a through via 38 (also referred to as a terminal via).

Figure 2:
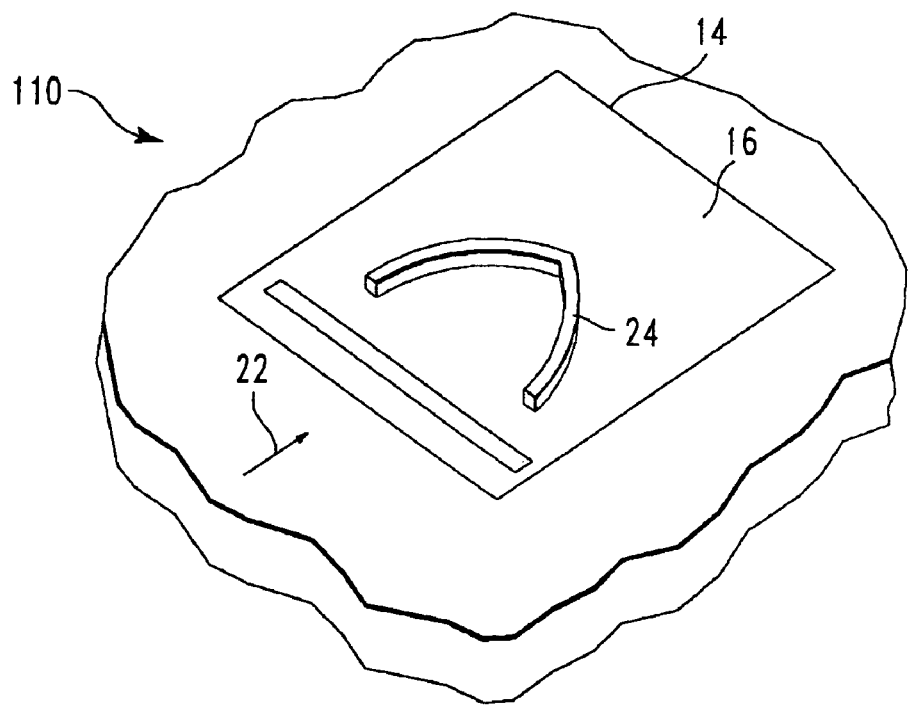

Referring now to FIG. 2, a second embodiment 110 of the wedgebond structure is illustrated. The second embodiment 110 of the wedgebond structure is identical to the first embodiment 10 of the wedgebond structure except that in the second embodiment 110 of the wedgebond structure, there is a curved feature 24 for receiving the wedge bond (not shown).

In both of the embodiments 10, 110 of the wedgebond structure, the v-shaped feature 20 (FIG. 1) and curved feature (24) extend above the surface 16 of the wedgebond pad 14 and are also parallel to the surface 16.

Figure 3:
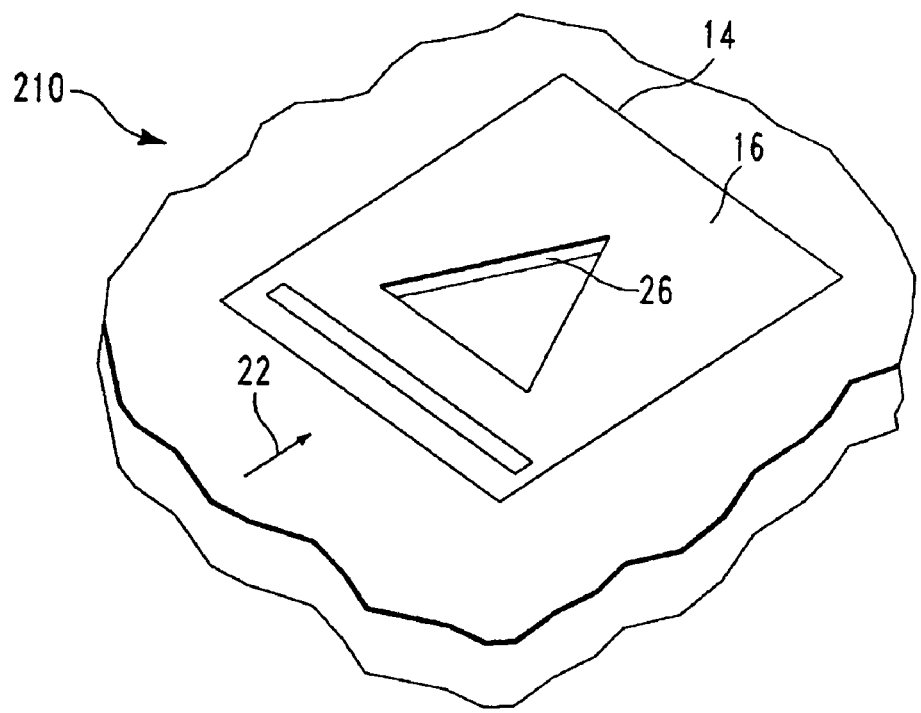
Figure 4:
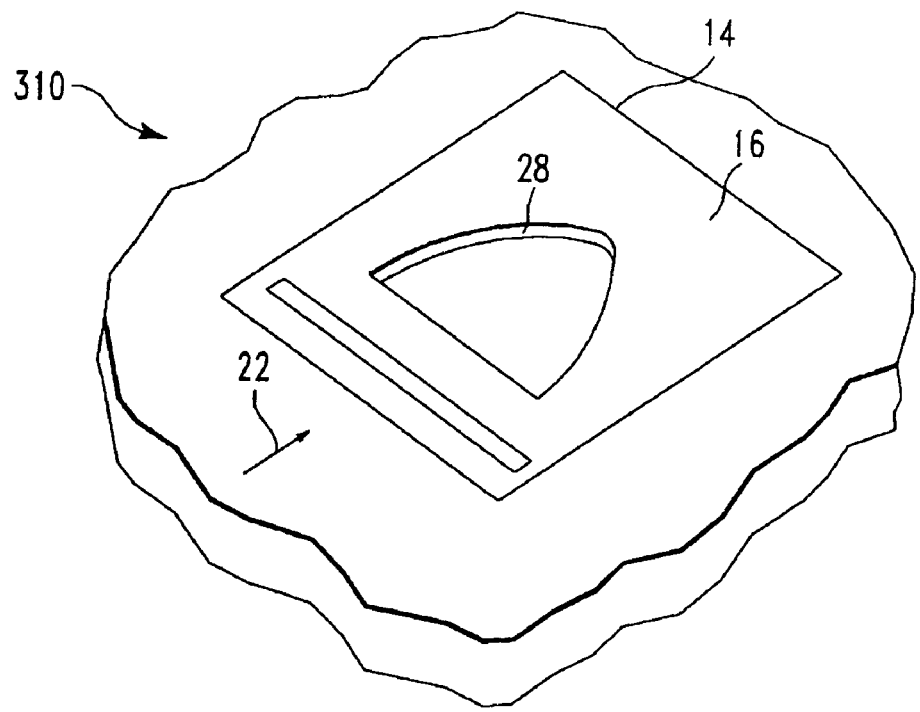

Referring now to FIGS. 3 and 4, there are third 210 and fourth 310 embodiments, respectively, of the wedgebond structure. In both of these embodiments 210, 310 of the invention, the feature that receives the wedge bond is recessed below the surface 16 of the wedgebond pad 14 and is also parallel to the surface 16. In FIG. 3, the third embodiment 210 of the present invention comprises a recessed v-shaped feature 26 while in FIG. 4, the fourth embodiment 310 of the present invention comprises a recessed curved feature 28.

All of the four embodiments 10, 110, 210, 310 of the present invention are related in that each embodiment 10, 110, 210, 310 includes a feature 20, 24, 26, 28 which catches or receives a wedge bond. This feature may be v-shaped 20, 26 as shown in FIGS. 1 and 3, curved 24, 28 as shown in FIGS. 2 and 4, raised 20, 24 as shown in FIGS. 1 and 2 or recessed 26, 28 as shown in FIGS. 3 and 4. The included angle encompassed by the v-shape 20, 26 or curve 24, 28 is not critical and can be optimized by experimentation for a given wedge bond condition.

While not shown, the v-shaped feature 20, 26 can include its mirror image so that a rectangle or diamond can be formed. Similarly, the curved feature 24, 28 can include its mirror image so that a circle or oval is formed (also not shown).

Referring now to FIGS. 5 through 9, the method for forming the wedgebond pad structure 10 of FIG. 1 will be discussed. In each of FIGS. 5 through 9, there are two views shown. One view, always the "A" view, is taken in the direction of arrows A—A shown in FIG. 1. The second view, always the "B" view, is taken in the direction of arrows B—B shown in FIG. 1. Referring first to FIGS. 5A and 5B, metallic layer 30 (the last internal wiring level) is conventionally formed on substrate 12 which may be semiconductor material such as silicon, silicon germanium, and the like, or more typically, is a previous wiring level already fabricated on the semiconductor material. For the sake of clarity, details of any previous wiring levels are not shown. The metallic material of metallic layer 30 may be aluminum or copper but preferably is copper. The nominal thickness of the metallic layer 30 can range from 0.4 to 1.2 microns but is typically about 0.5 microns. Thereafter, dielectric layer 34 is conventionally formed on substrate 12 and metallic layer 30. Dielectric layer 34 may be comprised of two separately formed dielectric layers 34A, 34B, if desired. Dielectric layer 34 is patterned by conventional means to form at least one through via 38 (shown in FIG. 5B) and nonplanar dielectric structure 36. The nonplanar dielectric structure 36 provides mechanical support to the wedgebond pad 14 during wedge bonding. The thickness of the dielectric layer 34 is nominally 0.5 to 10 microns.

If metallic layer 30 is copper and the metal to be subsequently deposited in through via 38 is aluminum, then it may be desirable to deposit a barrier layer (not shown) at the bottom of through via 38. Such a barrier layer could comprise Ta/TaN, TaN, Ti/TiN, W or combinations thereof. As a practical matter, the barrier layer would be present throughout the wedgebond pad 14.

Figure 6A:
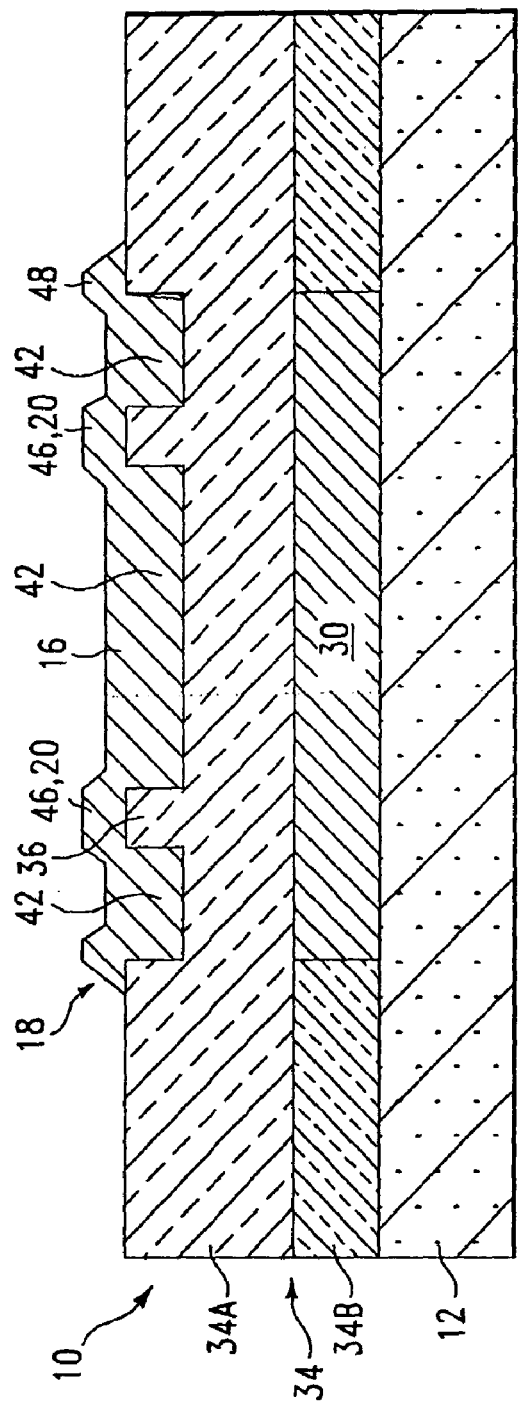
Figure 6B:
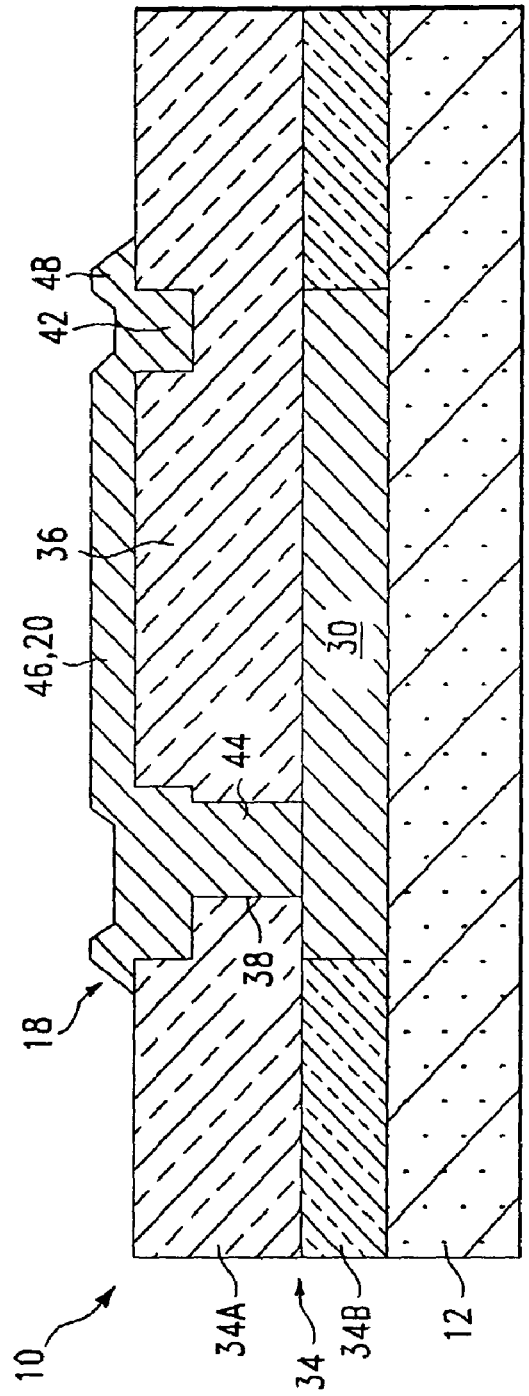

Thereafter, a blanket layer of metallic material, typically aluminum, is deposited over dielectric layer 34 and then patterned to result in metallic bond layer 48 as shown in FIGS. 6A and 6B. The metallic bond layer 48 fills the through via 38 (FIG. 6B) with metallic material 44 to make electrical contact with metallic layer 30 and fills the spaces between nonplanar dielectric structure 36 metallic material 42. Also formed at this time is a nonplanar metallic structure 46 (20 in FIG. 1) which substantially corresponds in shape to nonplanar dielectric structure 36 above the horizontal surface 16 of wedgebond pad 14. Since the metallic bond layer 48 is conformally formed, the nonplanar dielectric structure 36 will be substantially reproduced in the metallic bond layer 48 to form nonplanar metallic structure 46, 20. By "substantially reproduced" is meant that the general shape is reproduced but not exactly. That is, where the sides of the nonplanar dielectric structure 36 may be vertical, the sides of the nonplanar metallic structure 46, 20 may be sloped. Also, where the corners of the nonplanar dielectric structure 36 may be sharp, the corners of the nonplanar metallic structure 46, 20 may be rounded. The nominal thickness of the metallic bond layer 48 should be about 0.4 to 4 microns. The method of depositing metallic bond layer 48 is unimportant to the present invention.

Figure 8A:
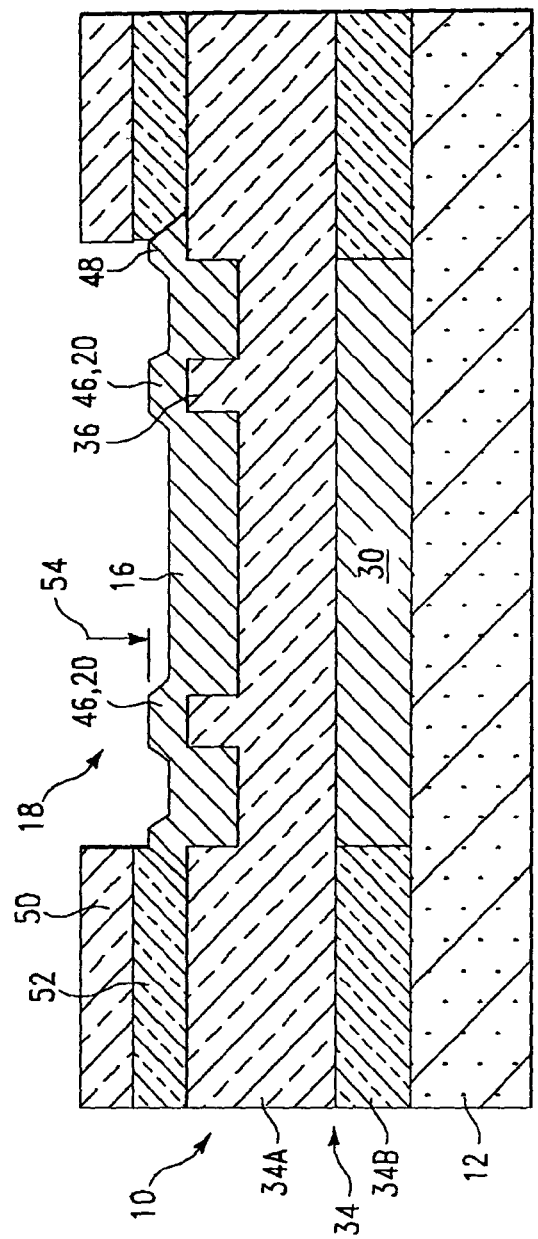
Figure 8B:
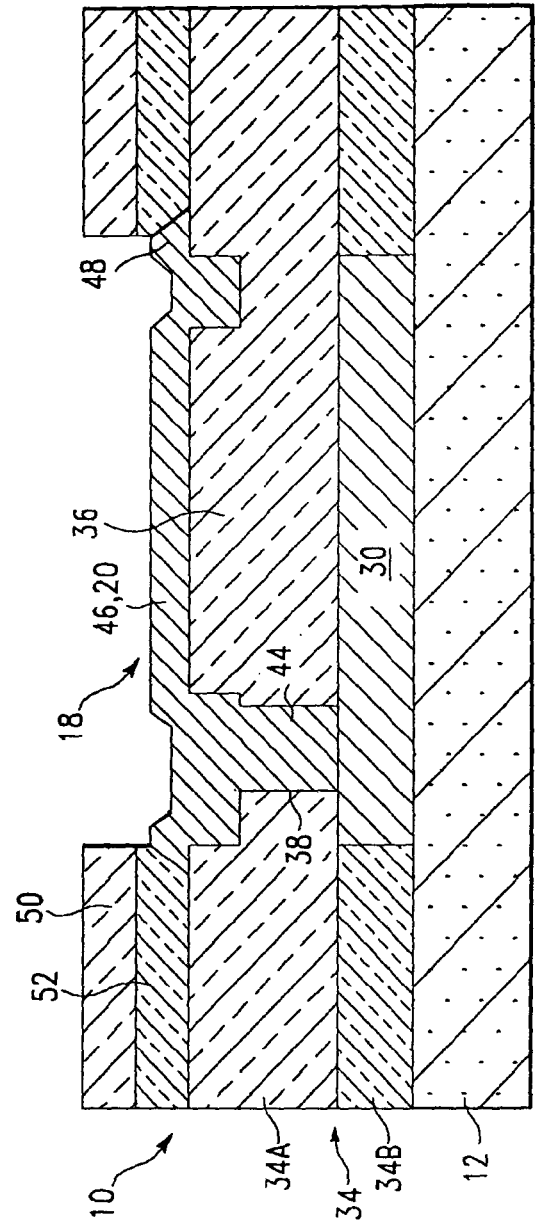
Figure 9A:
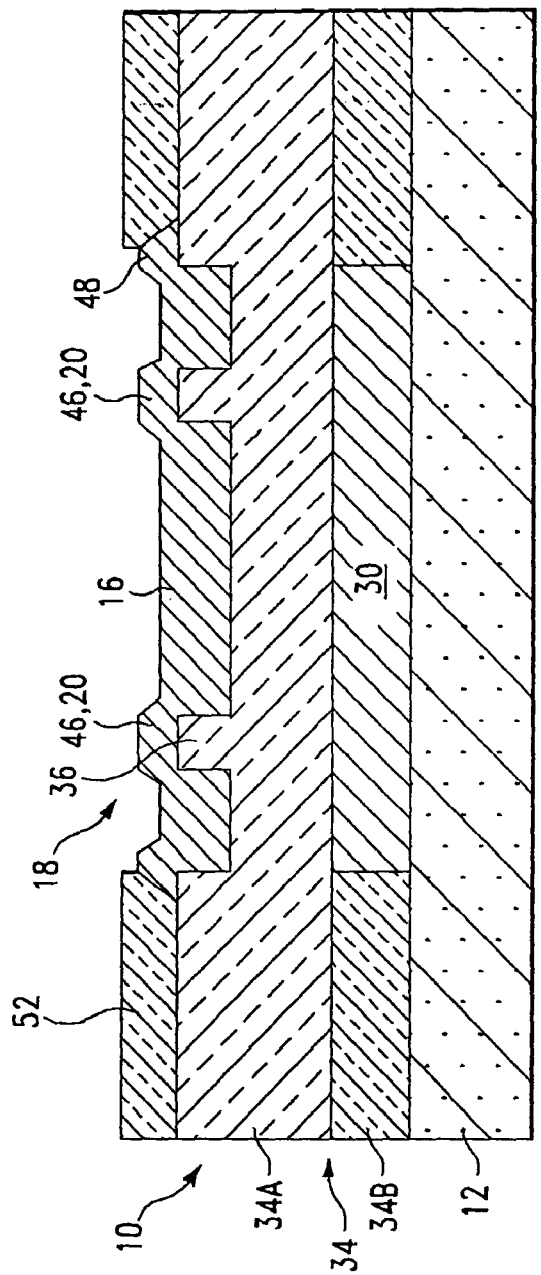
Figure 9B:
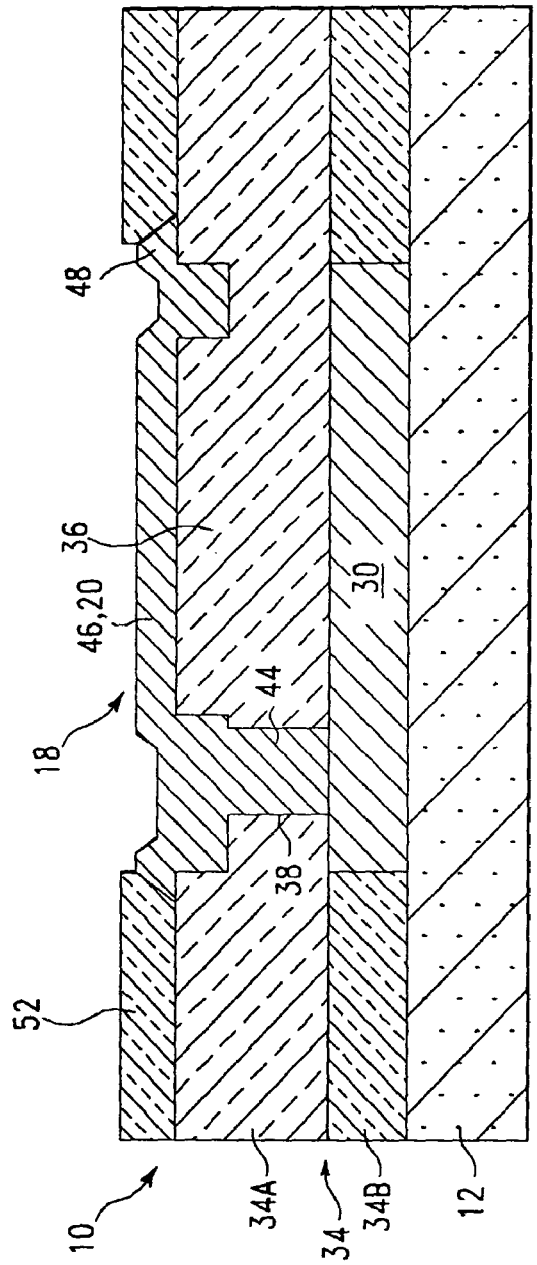

Referring now to FIGS. 7A and 7B, dielectric layer 52 is conventionally blanket deposited over dielectric layer 34 and metallic bond layer 48. Portions of dielectric layer 52 are masked 50 and then the unmasked portions of the dielectric layer 52 are subjected to a dry etchant such as reactive ion etching (RIE), indicated by arrows 54, to remove all of dielectric layer 52 over metallic layer 48 not covered by mask 50 as shown in FIGS. 8A and 8B. For convenience, mask 50 may be a photosensitive polyimide (PSPI).

If mask 50 is a PSPI, the wedgebond structure 10 would then be complete. Otherwise, mask 50 is removed by conventional means to result in the final wedgebond structure 10 shown in FIGS. 9A and 9B.

Further, the height 54 (FIG. 8A) of the nonplanar metallic structure 46 should be about 0.2 to 1.2 microns above the surface 16 of the wedgebond pad 14. Similarly, if the nonplanar metallic structure is recessed, then the nonplanar metallic structure 46 should be about 0.2 to 1.2 microns below the surface 16 of the wedgebond pad 14. At the minimum, the height 54 (or depth) of the nonmetallic structure 46 should be about 0.2 microns because small heights or depths may not have much effect on the wedgebond. At the maximum, the height 54 (or depth) of the nonmetallic structure 46 should be about 1.2 microns as values higher than this may result in voiding of the metallic material.

It should be understood that while the nonplanar metallic structures illustrated comprise solid segments or lines (i.e., the legs of the v-shaped feature 20 in FIG. 1 comprise two such solid segments), the nonplanar metallic structures could also comprise a plurality of separated or spaced-apart segments so long as they are close enough together and are robust enough to support a wedge bond.

It is believed that the wedgebond structures of the present invention will be advantageous by reducing the forces necessary for wedge bonding, thereby reducing the propagation of force to the underlying structure. Moreover, the present invention allows for increased surface area for bonding without increasing pad size in that it offers a physical step to catch the wedge bond.

It will be apparent to those skilled in the art having regard to this disclosure that other modifications of this invention beyond those embodiments specifically described here may be made without departing from the spirit of the invention. Accordingly, such modifications are considered within the scope of the invention limited solely by the appended claims.

What is claimed is:

1. A wedgebond pad structure comprising:
   a substrate;
   a metallic layer formed on the substrate;
   a dielectric layer over the metallic layer, at least one through via to the metallic layer and at least a portion of the dielectric layer comprising a nonplanar dielectric structure;
   a metallic bond layer conformally formed over the nonplanar structure of the dielectric layer such that the nonplanar dielectric structure is substantially reproduced in the metallic bond layer as a nonplanar metallic structure, the metallic bond layer further formed in the through via so as to contact the metallic layer, wherein the nonplanar metallic structure has a planar surface and only one curved or v-shaped feature for receiving a wedge bond wherein the surface is not coplanar with the curved or v-shaped feature.

2. The wedgebond pad structure of claim 1 wherein the nonplanar metallic structure has a surface and the curved or v-shaped feature extends above the surface.

3. The wedgebond pad structure of claim 2 wherein the curved or v-shaped feature extends above the surface by 0.2 to 1.2 microns.

4. The wedgebond pad structure of claim 1 wherein the metallic layer is copper.

5. The wedgebond pad structure of claim 1 wherein the metallic bond layer comprises aluminum.

6. The wedgebond pad structure of claim 1 wherein the nonplanar dielectric structures have vertical sides.

7. The wedgebond structure of claim 6 further comprising a barrier layer between the metallic layer and metallic bond layer wherein the barrier layer comprises TaN, Ta/TaN, Ti/TiN, W or combinations thereof.

* * * * *